United States Patent [19]

de Ronde

[11] Patent Number: 4,490,695

[45] Date of Patent: Dec. 25, 1984

[54] WIDEBAND POWER ADDER-DIVIDER FOR HIGH-FREQUENCY CIRCUITS AND IMPEDANCE TRANSFORMER REALIZED ON THE BASIS OF THE ADDER-DIVIDER

[75] Inventor: Frans C. de Ronde, Lesigny, France

[73] Assignee: U.S. Philips Corporation, New York, N.Y.

[21] Appl. No.: 471,933

[22] Filed: Mar. 3, 1983

[30] Foreign Application Priority Data

Mar. 12, 1982 [FR] France ................................ 82 04251

[51] Int. Cl.3 .......................... H01P 5/12; H03H 7/48; H03H 7/38

[52] U.S. Cl. ....................................... 333/128; 333/34

[58] Field of Search ............... 333/128, 127, 125, 124, 333/116, 34, 35, 246, 136

[56] References Cited

U.S. PATENT DOCUMENTS 3,815,055 6/1974 Plunk et al. .

3,886,498 5/1975 Mosko et al. .

FOREIGN PATENT DOCUMENTS 1330408 9/1973 United Kingdom .

*Primary Examiner*—Paul Gensler

*Assistant Examiner*—Benny Lee

*Attorney, Agent, or Firm*—Robert J. Kraus

[57] ABSTRACT

A wideband power adder-divider for high-frequency circuits including a first conductive transmission line (10) for passing a high-frequency current, second and third conductive transmission lines (20) and (30) over which this high-frequency current is distributed, and a conductive wedge-shaped transition section (40) joining the first to the second and third lines. This section has two arc-shaped outer edges (41) and (42) which are tangentially connected at one end of the section to the first line and at the other end to the second and third lines. The section includes parallel slots extending transversely to the direction of propagation of the current. The parallel slots (51) to (58) have ends which are separated from the arc-shaped edges by a distance which is less than the width of the second and third transmission lines.

7 Claims, 3 Drawing Figures

WIDEBAND POWER ADDER-DIVIDER FOR HIGH-FREQUENCY CIRCUITS AND IMPEDANCE TRANSFORMER REALIZED ON THE BASIS OF THE ADDER-DIVIDER

BACKGROUND OF THE INVENTION

The present invention relates to a wideband power adder-divider for high-frequency circuits of a planar structure and produced more specifically in accordance with printed circuit techniques in microstrip form. The invention also relates to an impedance transformer based on this adder-divider.

The solution which is most frequently employed for impedance matching purposes is the use of quarterwave transformers, particularly as described in the article "General Synthesis of Quarter-Wave Impedance Transformers," H. J. Riblet, IRE Trans. MTT, January 1957, pages 36 to 43, or in the article "Design of stepped microstrip components", G. Kompa, The Radio and Electronic Engineer, Vol. 48, No. ½, January/February 1978, pages 53–63 (particularly FIG. 13). These transformers, however, only match impedances for one single frequency. The reflections which are produced in the region of the two discontinuities do not counterbalance each other outside a band of approximately 1 octave centred at this frequency.

A better solution is the use of a transmission line having a non-uniform width ("taper") which is equivalent to an impedance transformer formed by a larger number of gaps of small dimensions. Such a transmission line is described in the article "Impedance Matching by Tapered Transmission Lines", A. H. Hall, The Microwave Journal, March 1966, pages 109 to 114. With such an arrangement a much beter passband and a much better, perhaps even optimum, distribution of the local reflections are obtained, but at the expense of a longer total length.

SUMMARY OF THE INVENTION

It is an object of the invention to provide a high-frequency power adder-divider of limited size which effectively matches impedances over a frequency band of several octaves.

To this end, the invention relates to an adder-divider comprising at one end a first conductive transmission line through which the whole high-frequency current flows and at the other end two conductive transmission lines to which this current is distributed. Connecting the first line to the two lines is a wedge-shaped conductive transitional section having two arc-shaped outer edges. One end of the transitional section is joined to the first line and the other end is joined to the two lines. The section includes parallel slots extending transversely to the direction of propagation of the current. The ends of these slots are situated at a distance from the arc-shaped outer edges which is less than the width of the two transmission lines, and the spacing between the slots is significantly less than the wavelength. This forces the current to remain within a limited width of the transmission line, which prevents sudden impedance variations from occurring in the transition section, which variations might cause mismatch.

BRIEF DESCRIPTION OF THE DRAWING

The invention and its advantages will now be described by way of non-limitative example with reference to the accompanying drawing in which.

DESCRIPTION OF THE PREFERRED EMBODIMENTS

Figure 1:
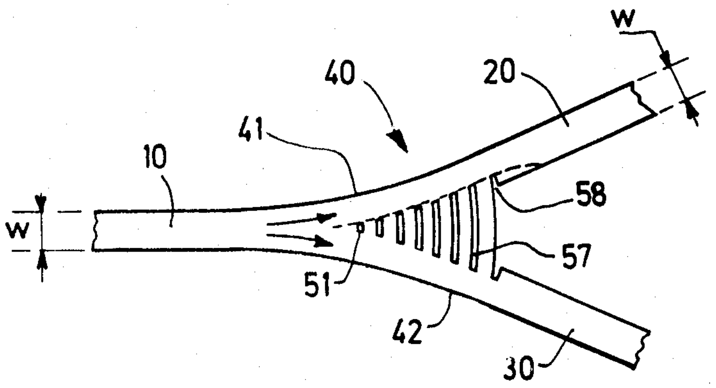
FIG. 1 shows a first embodiment of a power adder-divider in accordance with the invention.

The power adder-divider shown in FIG. 1 is intended for inclusion in a planar high-frequency circuit of the microstrip type, and comprises a first conductive transmission line 10, having width w, through which the whole high frequency current flows, and second and third conductive transmission lines 20 and 30, also having a width w, to which this high-frequency current is distributed. Between the line 10 and the two lines 20 and 30 is a wedge-shaped conducting transition section 40 having two arc-shaped outer edges 41 and 42, which are tangentially connected to the first line 10 and to the second and third lines 20 and 30.

Figure 2:
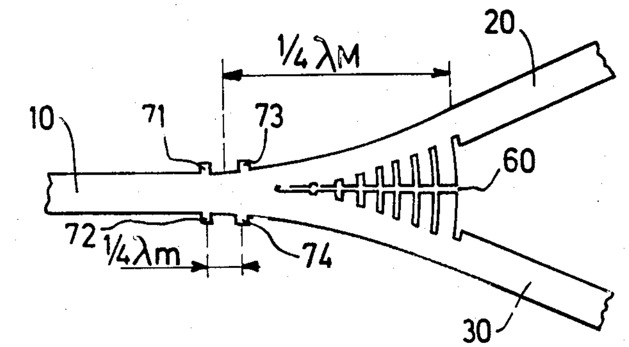
FIG. 2 shows a variation of this embodiment.

The section 40 is traversed transversely to the current propagation direction (indicated in FIG. 1 by two arrows in parallel with the contours 41 and 42 for the case in which the arrangement is a power divider) by parallel arc-shaped slots. They might alternatively be rectilinear. Eight slots 51 to 58 are shown in the example, each having ends which are spaced at a distance from the arc-shaped edges which is less than the width of the transmission lines. This structure forces the current to remain within a conducting band which has a width which is less than the width of the lines 10 to 30. (The approximate limit of this current circulation band is shown in FIG. 1 by means of broken lines.) This prevents sudden impedance variations from occurring during the passage of the current through the transition section 40 and thus realises a progressive distribution of the reflections along the arrangement. A better electric symmetry of the arrangement can be obtained if a longitudinal slot 60 is provided (see FIG. 2) in the whole transition section 40, which slot 60 extends perpendicularly through the centers of the slots 51 to 58. The longitudinal slot insulates the two lines 20 and 30. This insulation is particularly useful when the arrangement operates as an adder and may be even further improved by coating the slot 60 with an absorbing layer.

Figure 3:
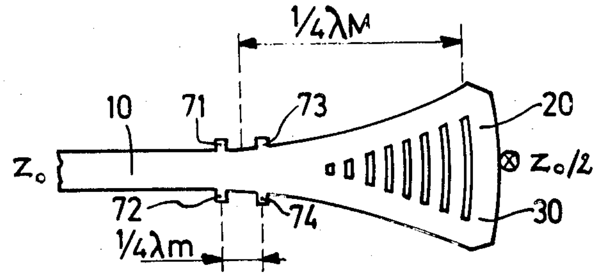
FIG. 3 shows an impedance transformer realised on the basis of the adder-divider of FIG. 1.

The present invention is of course not limited to such embodiments; on the basis of these embodiments variations can be proposed without departing from the scope of the invention. It is more specifically possible to use the above-described adder-divider to realise a wideband impedance transformer which is obtained as shown in FIG. 3 by connecting together the second and third conductive transmission lines 20 and 30. Also, any low-frequency residual reflections in the passband of the adder-divider or impedance transformer can be wholly eliminated by the capacitive line stubs 71 to 74 which are arranged transversely of the line 10 at a distance from each other equal to a quarter of the wavelength $\lambda_m$ associated with the maximum frequency of the passband, and at a mean distance from the other end of the arrangement (the border between the zone 40 and the lines 20 and 30) equal to a quarter of the wavelength $\lambda_M$ which is associated with the minimum frequency of the passband.

What is claimed is:

1. A wide band microstrip power adder-divider comprising:

(a) a first conductive transmission line for passing a current having a frequency in said band;

(b) second and third conductive transmission lines in which the current is to be distributed; and (c) a wedge-shaped conductive transition section joining the first to the second and third conductive transmission lines, said transition section having two arc-shaped outer edges which at one end of said section meet respective outer edges of the first transmission line, and at the other end of said section meet respective outer edges of the second and third transmission lines, said transition section including a plurality of parallel slots extending transversely of the direction of propagation of the current, opposite ends of said slots each being spaced from the nearest arc-shaped outer edge by a distance which is less than the width of each of said second and third conductive transmission lines.

2. A power adder-divider as in claim 1 where the parallel slots are arc-shaped.

3. A power adder-divider as in claim 1 or 2 including a longitudinal slot extending through the transition section substantially at the centers of the parallel slots.

4. A power adder-divider as in claim 3 where the transition section is coated with an absorbing layer at the location of the longitudinal slot.

5. A power adder-divider as in claim 1 or 2 including two pairs of capacitive line stubs, each pair extending outwardly from a respective one of the arc-shaped outer edges at a mean distance from a border between the transition section and the second and third transmission lines approximately equal to a quarter of the wavelength corresponding to the minimum frequency of the band, the stubs in each pair being separated from each other by a mean distance approximately equal to one-quarter of the wavelength of the maximum frequency of said band.

6. An impedance transformer comprising:

(a) a first conductive transmission line for passing a current having a frequency in said band;

(b) second and third conductive transmission lines in which the current is to be distributed, said second and third conductive transmission lines being connected together; and (c) a wedge-shaped conductive transition section joining the first to the second and third conductive transmission lines, said transition section having two arc-shaped outer edges which at one end of said section meet respective outer edges of the first transmission line, and at the other end of said section meet respective outer edges of the second and third transmission lines, said transition section including a plurality of parallel slots extending transversely of the direction of propagation of the current, oppsite ends of said slots each being spaced from the nearest arc-shaped outer edge by a distance which is less than the width of each of said second and third conductive transmission lines.

7. An impedance transformer as in claim 6 where the parallel slots are arc-shaped.

* * * * *